United States Patent
Yinn et al.

(10) Patent No.: US 8,368,468 B2
(45) Date of Patent: Feb. 5, 2013

(54) ERROR AMPLIFIER AND LED CIRCUIT COMPRISING THE SAME

(75) Inventors: Aung Aung Yinn, Sinshih Township, Tainan County (TW); Chow-Peng Lee, Sinshih Township, Tainan County (TW)

(73) Assignee: Himax Analogic, Inc., Tainan County (TW)

( * ) Notice: Subject to any disclaimer, the term of this patent is extended or adjusted under 35 U.S.C. 154(b) by 509 days.

(21) Appl. No.: 12/783,995

(22) Filed: May 20, 2010

(65) Prior Publication Data

US 2011/0285304 A1    Nov. 24, 2011

(51) Int. Cl.
*H03F 3/16* (2006.01)
(52) U.S. Cl. ........................... 330/277; 330/255
(58) Field of Classification Search .................. 330/277, 330/255, 253, 264
See application file for complete search history.

(56) References Cited

U.S. PATENT DOCUMENTS

| | | | |
|---|---|---|---|
| 7,602,248 B2* | 10/2009 | Ishiguro | 330/255 |
| 8,054,134 B2* | 11/2011 | Huang et al. | 330/292 |
| 8,149,054 B2* | 4/2012 | Shibuya | 330/255 |
| 2012/0062320 A1* | 3/2012 | Fan et al. | 330/269 |

\* cited by examiner

*Primary Examiner* — Henry Choe
(74) *Attorney, Agent, or Firm* — McClure, Qualey & Rodack, LLP

(57) ABSTRACT

An error amplifier and a LED circuit comprising the same are provided. The LED circuit comprises an inductor, a group of LEDs and a power MOS connected to the inductor, an error amplifier and a pulse width modulator controlling the gate of the power MOS according to an error amplifier output. The error amplifier comprises a differential input stage, an output stage having a first NMOS, a first PMOS, a second NMOS, a second PMOS and a control switch module. During a first operation mode, the control switch module connects the first NMOS and PMOS and connects the second NMOS and PMOS, and during a second operation mode, control switch module disables the second NMOS and PMOS.

18 Claims, 3 Drawing Sheets

ERROR AMPLIFIER AND LED CIRCUIT COMPRISING THE SAME

BACKGROUND

1. Technical Field

The present disclosure relates to an amplifier. More particularly, the present disclosure relates to an error amplifier and a LED circuit comprising the same.

2. Description of Related Art

LEDs are estimated to be four times as efficient as conventional incandescent lights. They are also claimed to be more economically sound than compact fluorescent bulbs that contain harmful mercury and are supposed to last a lot longer than the conventional lighting. Thus, LEDs may become the mainstream of the lighting technology.

An inductor is often used to stabilize the voltage of the LED circuit. When the LED circuit begins to operate, a fast response time is needed to turn the LED circuit into the work mode quickly. The fast response time of the LED circuit is able to generate a large current within a short time period. However, the inductor mentioned above is not able to bear an inrush current generated due to the fast response time. Thus, if the LED circuit doesn't have a flexible adjusting mechanism on the response time, the inductor may suffer from the inrush current during the work mode and may fail to operate normally, which is an undesired result.

Accordingly, what is needed is a LED circuit with a new design of error amplifier and a LED circuit comprising the same to provide a flexible adjusting mechanism on the response time.

SUMMARY

An aspect of the present disclosure is to provide an error amplifier comprising: a differential input stage, an output stage and a control switch module. The differential input stage comprises a differential output. The output stage comprises a first NMOS, a first PMOS, a second NMOS and a second PMOS. The first NMOS has a drain connected to an error amplifier output and a gate connected to the differential output. The first PMOS has a gate connected to a gate controller and a drain connected to the drain of the first NMOS. The second PMOS has a drain connected to the drain of the second NMOS. During a first operation mode, the control switch module makes the gate of the second PMOS connected to the gate controller, the gate of the second NMOS connected to the differential output and the drain of the second PMOS connected to the error amplifier output, and during a second operation mode, the control switch module makes the second PMOS and the second NMOS isolated from the gate controller, the differential output and the error amplifier output.

Another aspect of the present disclosure is to provide a LED circuit comprising: an inductor, a group of LEDs, a power MOS, an error amplifier and a pulse width modulator (PWM). The inductor is connected to a voltage supply and a first node. The group of LEDs is connected to the first node. The power MOS is connected to the first node. The error amplifier comprises: a differential input stage, an output stage and a control switch module. The differential input stage comprises a differential output. The output stage comprises a first NMOS, a first PMOS, a second NMOS and a second PMOS. The first NMOS has a drain connected to an error amplifier output and a gate connected to the differential output. The first PMOS has a gate connected to a gate controller and a drain connected to the drain of the first NMOS. The second PMOS has a drain connected to the drain of the second NMOS. During a first operation mode, the control switch module makes the gate of the second PMOS connected to the gate controller, the gate of the second NMOS connected to the differential output and the drain of the second PMOS connected to the error amplifier output, and during a second operation mode, the control switch module makes the second PMOS and the second NMOS isolated from the gate controller, the differential output and the error amplifier output. The pulse width modulator (PWM) generates a switching signal according to the error amplifier output to control the gate of the power MOS to charge or discharge the group of LEDs.

It is to be understood that both the foregoing general description and the following detailed description are by examples, and are intended to provide further explanation of the disclosure as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
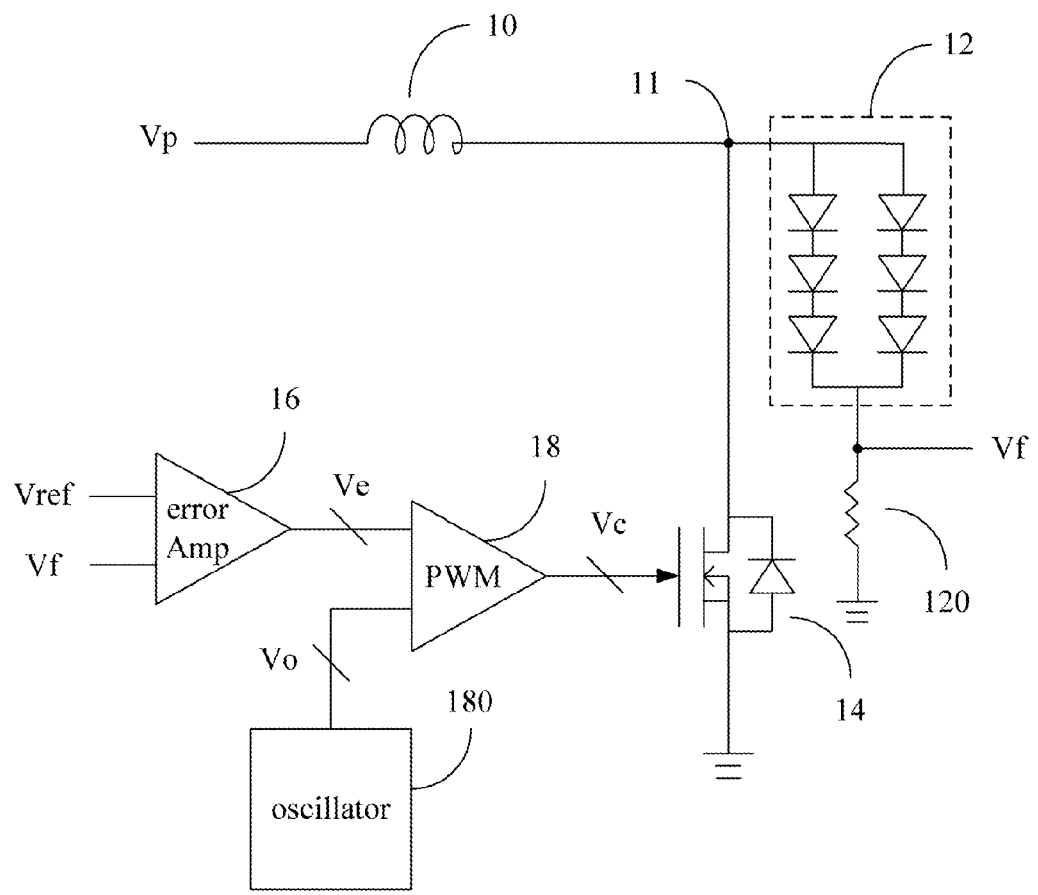
FIG. 1 is a diagram of a LED circuit of an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Please refer to FIG. 1. FIG. 1 is a diagram of a LED circuit 1 of an embodiment of the present disclosure. The LED circuit 1 comprises: an inductor 10, a group of LEDs 12, a power MOS 14, an error amplifier 16 and a pulse width modulator 18.

The inductor 10 is connected to a voltage supply Vp and a first node 11 to provide a stabilization mechanism on the voltage. The group of LEDs 12 is connected to the first node 11 and a ground potential. In the present embodiment, a load 120 is substantially connected between the ground potential and the group of LEDs 12. The power MOS 14 is connected to the first node 11 and the ground potential.

The error amplifier 16 receives a reference voltage Vref and a feedback voltage Vf. In the present embodiment, the feedback voltage Vf is from the output of the group of LEDs 12, as depicted in FIG. 1. In other embodiment, the feedback voltage can be other voltage related to the group of LEDs 12. The feedback voltage Vf is a varying voltage, wherein the varying value of the feedback voltage Vf depends on the operation status of the LED circuit 1. The error amplifier 16 then generates an error amplifier output voltage Ve at the error amplifier output. The pulse width modulator 18 receives the error amplifier output voltage Ve from the error amplifier output. The LED circuit 1 in the present embodiment further comprises an oscillator 180 to generate a saw-tooth-shaped oscillating voltage Vo. The pulse width modulator 18 receives both the output voltage Ve and the oscillating voltage Vo to generate a switching signal altering between an active period and an inactive period. The switching signal is further transmitted to the gate of the power MOS 14 to control the charging or discharging activity of the group of LEDs 12.

In an embodiment, the oscillating voltage Vo keeps the same waveform. Thus, the magnitude of the error amplifier output voltage Ve determines the duration of the active and inactive periods of the switching signal. When the switching signal makes the power MOS activate the charging mechanism, the group of LEDs 12 turn on to emit light. In contrast, when the switching signal makes the power MOS activate the discharging mechanism, the group of LEDs 12 turn off. Consequently, the generation of the output voltage Ve determines the charging and discharging activity and further determines the amount of current on the first node 11.

When the LED circuit 1 begins to operate, a fast response time is needed to turn the LED circuit 1 into the work mode quickly. The fast response time can be accomplished by setting the error amplifier output voltage Ve a high increase/decrease rate. If the error amplifier output voltage Ve varies quickly, the response speed becomes faster. However, a large current is often generated within a short time period due to the fast response time. The inductor 10 mentioned above is not able to bear the inrush current generated by the fast response time. Thus, if the error amplifier 16 of the LED circuit 1 doesn't have a flexible adjusting mechanism on the response time and keeps the high increase/decrease rate all the time, the inductor 10 may suffer from the inrush current during the work mode and may fail to operate normally, which is an undesired result.

Figure 2:
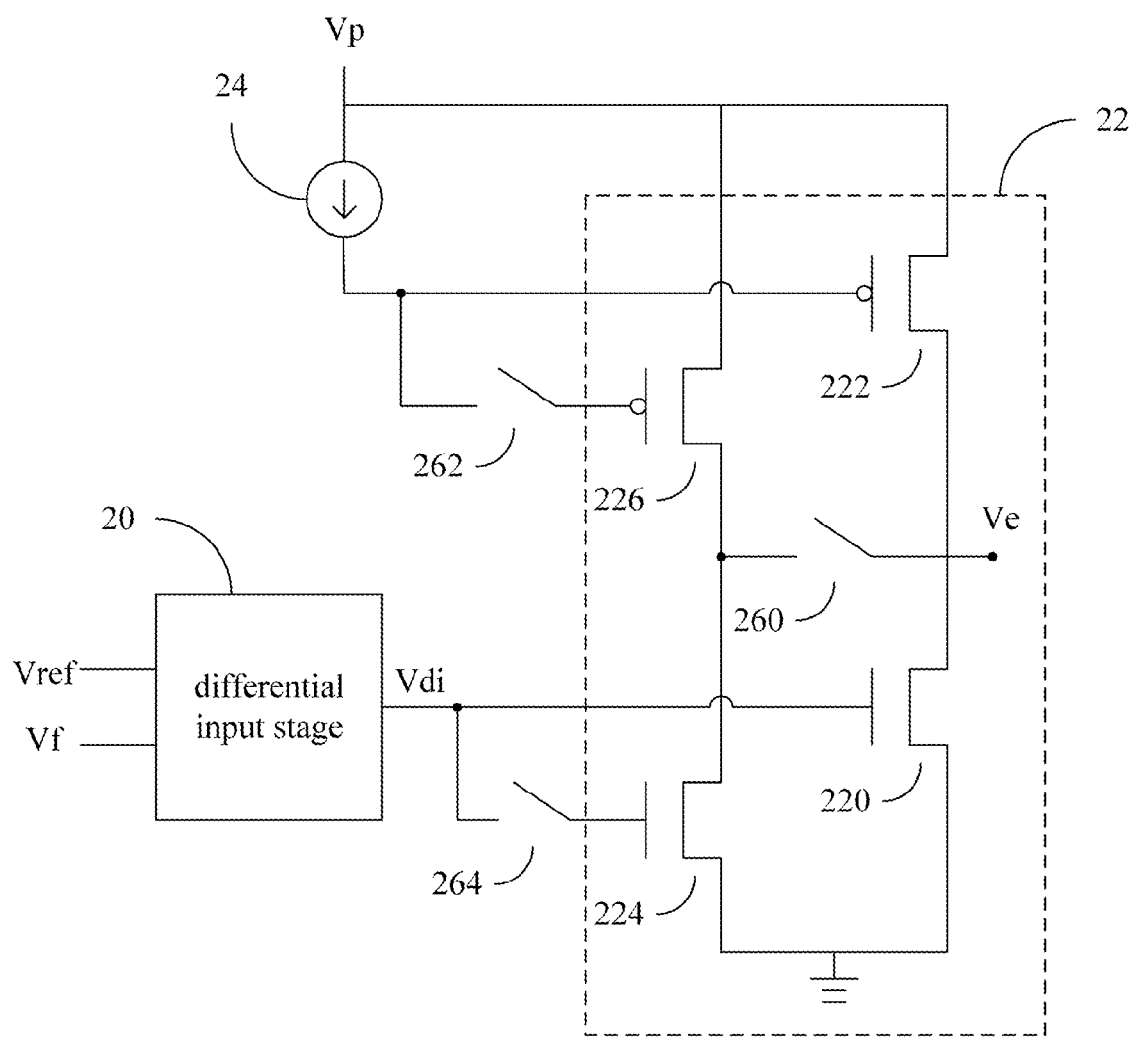
FIG. 2 is a detailed diagram of the error amplifier of an embodiment of the present disclosure.

Please refer to FIG. 2. FIG. 2 is a detailed diagram of the error amplifier 16 of an embodiment of the present disclosure. The error amplifier 16 comprises a differential input stage 20, an output stage 22 and a control switch module.

The differential input stage 20 comprises a first input to receive the reference voltage Vref, a second input to receive the feedback voltage Vf and a differential output. The differential output generates a differential output voltage Vdi according to the difference of the reference voltage Vref and the feedback voltage Vf. In the present embodiment, the reference voltage Vref is a fixed value and the feedback voltage Vf is a varying value, wherein the value depends on the operation status of the group of LEDs 12 in FIG. 1.

The output stage 22 comprises a first NMOS 220, a first PMOS 222, a second NMOS 224 and a second PMOS 226. The first NMOS 220 has a drain connected to the error amplifier output that generates the error amplifier output voltage Ve and a gate connected to the differential output that generates the differential output voltage Vdi. In the present embodiment, the source of the first NMOS 220 is connected to the ground potential. The first PMOS 222 has a gate connected to a gate controller 24 and a drain connected to the drain of the first NMOS 220. The gate controller 24 in the present embodiment is a current source, wherein in other embodiment the gate controller 24 can be a control voltage to control the first PMOS 222. In the present embodiment, the source of the first PMOS 222 is connected to the voltage supply Vp. The second PMOS 226 has a drain connected to the drain of the second NMOS 224. In the present embodiment, the source of the second PMOS 226 is connected to the voltage supply Vp, and the source of the second NMOS 224 is connected to the ground potential as well.

The control switch module in the present embodiment comprises a first switch 260, a second switch 262 and a third switch 264. The first switch 260 is connected between the drains of the second PMOS 226 and the error amplifier output. The second switch 262 is connected between the gate of the second PMOS 226 and the gate controller 24. The third switch 264 is connected between the gate of the second NMOS 224 and the differential output.

Figure 3A:
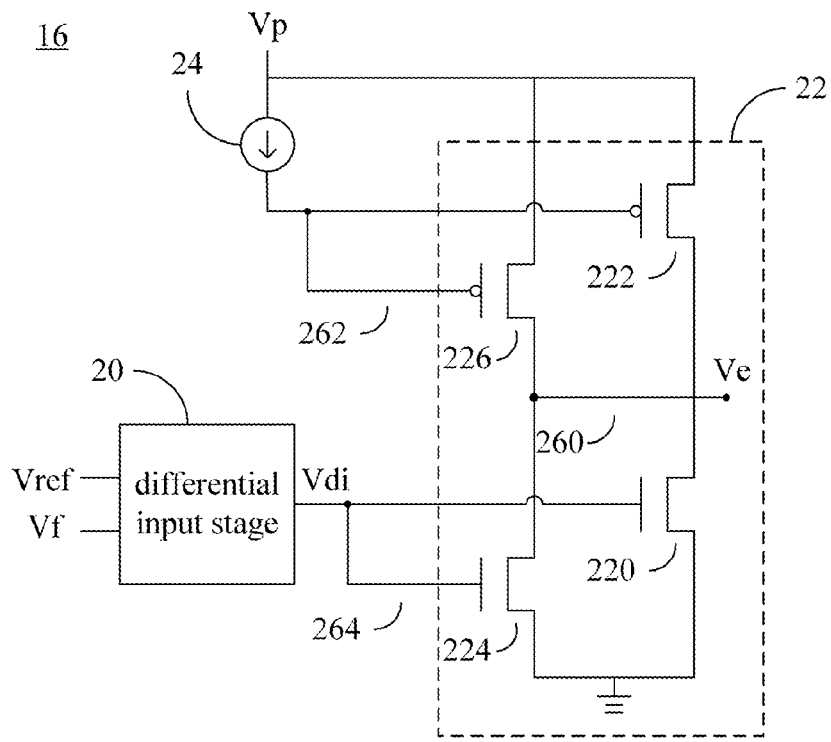
FIG. 3A and FIG. 3B are the diagrams depicting the error amplifier during two different operation modes of an embodiment of the present disclosure.
Figure 3B:
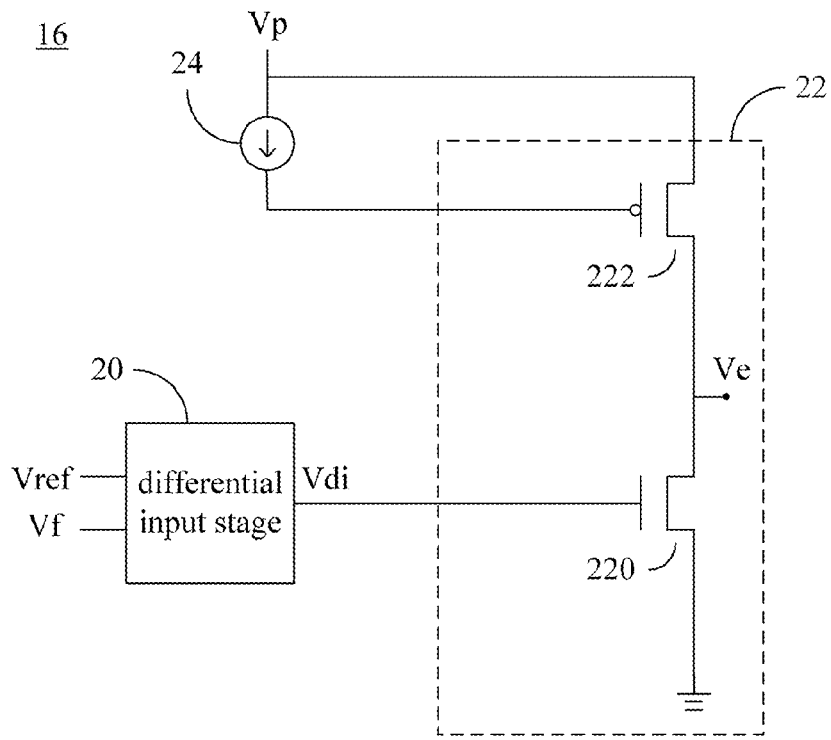

In the present embodiment, a control voltage (not shown) having a first state and a second state can be used to control the operation of the first switch 260, the second switch 262 and the third switch 264. Please refer to FIG. 3A and FIG. 3B at the same time. FIG. 3A and FIG. 3B are the diagrams depicting the error amplifier 16 during two different operation modes of an embodiment of the present disclosure.

During a first operation mode, the control voltage is in the first state to close the first switch 260, the second switch 262 and the third switch 264 to further make the gate of the second PMOS 222 connected to the gate controller 24 through the second switch 262, the gate of the second NMOS 224 connected to the differential output through the third switch 264 and the drain of the second PMOS 222 connected to the error amplifier output through the first switch 260. FIG. 3A shows the equivalent diagram of the error amplifier 16 during the first operation mode. According to FIG. 3A, during the first operation mode, the first PMOS 226 and the second PMOS 222 are connected in parallel, whereas the first NMOS 220 and the second NMOS 224 are connected in parallel.

During a second operation mode, the control voltage is in the second state to open the first switch 260, the second switch 262 and the third switch 264 to further make the second PMOS 226 and the second NMOS 224 isolated from the gate controller, the differential output and the error amplifier output. FIG. 3B shows the equivalent diagram of the error amplifier 16 during the second operation mode. According to FIG. 3B, only the first PMOS 226 and the first NMOS 220 are active during the second operation mode.

As a result, the transconductance of the output stage 22 increases when the error amplifier 16 switches from the second operation mode to the first operation mode and the response becomes faster, which means that the error amplifier output voltage Ve varies quickly. On the contrary, the transconductance of the output stage 22 decreases when the error amplifier 16 switches from the first operation mode to the second operation mode and the response becomes slower.

In an embodiment, when the LED circuit 1 begins to operate, the control switch module can operate in the first operation mode to increase the transconductance of the output stage 22 such that the error amplifier 16 has a fast response time to increase the output voltage/current in a short time period so that the LED circuit 1 can turn from an initial state to the work mode quickly. And when the LED circuit 1 operates over a specific time period, the LED circuit 1 is determined to be stable in the work mode, and the control switch module switches to the second operation mode to decrease the transconductance of the output stage 22 so that the voltage/current on the first node 11 will not have a sudden increase or decrease to do harm to the inductor 10.

In another embodiment, when the LED circuit 1 begins to operate, the control switch module can operate in the first operation mode to increase the transconductance of the output stage 22 as described previously. And a detection mechanism is performed on the reference voltage Vref and the feedback voltage Vf such that when the difference between the reference voltage Vref and the feedback voltage Vf is below a threshold value after the LED circuit 1 begins to operate, the LED circuit 1 is determined to operate in a stable state. Therefore, the control switch module operates in the second operation mode to decrease the transconductance of the output stage 22.

In yet another embodiment, during the operation of the LED circuit, the detection mechanism described above can be used throughout the work mode. When the difference between the reference voltage Vref and the feedback voltage Vf is over the threshold value, the LED circuit 1 is determined to operate in an unstable state. For example, if the feedback voltage Vf is too large or too small for the group of LEDs 12 to operate normally, the control switch module can operate in the first operation mode to increase the transconductance of the output stage 22 quickly to further lower or raise the voltage/current on the first node 11 as soon as possible. When the difference between the reference voltage Vref and the feedback voltage Vf is below the threshold value, the LED circuit 1 is determined to operate in the stable state, and the control switch module operates in the second operation mode to decrease the transconductance of the output stage 22.

It's noticed that the increase or decrease of the output voltage of the error amplifier is determined by the magnitude of the reference voltage Vref and the feedback voltage Vf. For example, in an embodiment, when the feedback voltage Vf is larger than the reference voltage Vref, the error amplifier 16 makes the output voltage lower, and when the feedback voltage Vf is smaller than the reference voltage Vref, the error amplifier 16 makes the output voltage higher. On the other side, the increase/decrease rate is determined by the difference of the reference voltage Vref and the feedback voltage Vf, i.e. by changing the transconductance of the output stage 22.

Accordingly, the error amplifier and the LED circuit comprising the same provided in the present disclosure have a flexible response time adjusting mechanism. By changing the transconductance of the output stage of the error amplifier, the increase/decrease rate of the output voltage of the error amplifier can switch to a suitable value depending on different situations. Therefore, the increase/decrease rate of the current/voltage supplied to the group of LEDs can change depending on different situations as well. Further, the damage of the inductor in the LED circuit due to the inrush current can be avoided.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. An error amplifier comprising:
a differential input stage comprising a differential output;
an output stage comprising:
   a first NMOS having a drain connected to an error amplifier output and a gate connected to the differential output;
   a first PMOS having a gate connected to a gate controller and a drain connected to the drain of the first NMOS;
   a second NMOS; and
   a second PMOS having a drain connected to the drain of the second NMOS; and
a control switch module;
wherein during a first operation mode, the control switch module makes the gate of the second PMOS connected to the gate controller, the gate of the second NMOS connected to the differential output and the drain of the second PMOS connected to the error amplifier output, and during a second operation mode, the control switch module makes the second PMOS and the second NMOS isolated from the gate controller, the differential output and the error amplifier output.

2. The error amplifier of claim 1, wherein during the first operation mode, the control switch module makes the gate of the second PMOS connected to the gate controller, the gate of the second NMOS connected to the differential output and the drain of the second PMOS connected to the error amplifier output to increase the transconductance of the output stage.

3. The error amplifier of claim 1, wherein during the second operation mode, the control switch module makes the second PMOS and the second NMOS isolated from the gate controller, the differential output and the error amplifier output to decrease the transconductance of the output stage.

4. The error amplifier of claim 1, wherein the control switch module comprises:
a first switch connected between the drains of the second PMOS and the error amplifier output;
a second switch connected between the gate of the second PMOS and the gate controller; and
a third switch connected between the gate of the second NMOS and the differential output.

5. The error amplifier of claim 1, wherein the differential input stage further comprises a first input to receive a reference voltage and a second input to receive a varying voltage, wherein the differential output generates a differential output voltage according to the reference voltage and the varying voltage.

6. The error amplifier of claim 1, wherein the gate controller is a current source.

7. A LED circuit comprising:
an inductor connected to a voltage supply and a first node;
a group of LEDs connected to the first node;
a power MOS connected to the first node;
an error amplifier comprising:
   a differential input stage comprising a differential output;
   an output stage comprising:
      a first NMOS having a drain connected to an error amplifier output and a gate connected to the differential output;
      a first PMOS having a gate connected to a gate controller and a drain connected to the drain of the first NMOS;
      a second NMOS; and
      a second PMOS having a drain connected to the drain of the second NMOS; and
   a control switch module, wherein during a first operation mode, the control switch module makes the gate of the second PMOS connected to the gate controller, the gate of the second NMOS connected to the differential output and the drain of the second PMOS connected to the error amplifier output, and during a second operation mode, the control switch module makes the second PMOS and the second NMOS isolated from the gate controller, the differential output and the error amplifier output; and
a pulse width modulator (PWM) to generate a switching signal according to the error amplifier output to control the gate of the power MOS to charge or discharge the group of LEDs.

8. The LED circuit of claim 7, wherein during the first operation mode, the control switch module makes the gate of the second PMOS connected to the gate controller, the gate of the second NMOS connected to the differential output and the drain of the second PMOS connected to the error amplifier output to increase the transconductance of the output stage.

9. The LED circuit of claim 7, wherein during the second operation mode, the control switch module makes the second PMOS and the second NMOS isolated from the gate controller, the differential output and the error amplifier output to decrease the transconductance of the output stage.

10. The LED circuit of claim 7, wherein the control switch module comprises:

a first switch connected between the drains of the second PMOS and the error amplifier output;

a second switch connected between the gate of the second PMOS and the gate controller; and a third switch connected between the gate of the second NMOS and the differential output.

11. The LED circuit of claim 7, wherein the differential input stage further comprises a first input to receive a reference voltage and a second input to receive a varying voltage, wherein the differential output generates a differential output voltage according to the reference voltage and the varying voltage.

12. The LED circuit of claim 11, wherein the varying voltage is a feedback voltage from the output of the group of LEDs.

13. The LED circuit of claim 11, wherein when the LED circuit begins to operate, the control switch module operates in the first operation mode to increase the transconductance of the output stage, and when the difference between the reference voltage and the varying voltage is below a threshold value after the LED circuit begins to operate, the control switch module operates in the second operation mode to decrease the transconductance of the output stage.

14. The LED circuit of claim 11, wherein during the operation of the LED circuit, when the difference between the reference voltage and the varying voltage is over a threshold value, the control switch module operates in the first operation mode to increase the transconductance of the output stage, and when the difference between the reference voltage and the varying voltage is below a threshold value, the control switch module operates in the second operation mode to decrease the transconductance of the output stage.

15. The LED circuit of claim 7, wherein when the LED circuit begins to operate, the control switch module operates in the first operation mode to increase the transconductance of the output stage, and when the LED circuit operates over a specific time period, the control switch module operates in the second operation mode to decrease the transconductance of the output stage.

16. The LED circuit of claim 7, wherein the pulse width modulator further receives an oscillating voltage from an oscillator, the pulse width modulator substantially generates the switching signal according to the error amplifier output and the oscillating voltage.

17. The LED circuit of claim 16, wherein the oscillating voltage is a saw-tooth-shaped voltage.

18. The LED circuit of claim 16, wherein the gate controller is a current source.

* * * * *